(12) United States Patent
Su et al.

(10) Patent No.: US 12,086,519 B2
(45) Date of Patent: Sep. 10, 2024

(54) METHOD AND APPARATUS FOR SETTING WAFER SCRIPT, DEVICE AND STORAGE MEDIUM

(71) Applicant: CHANGXIN MEMORY TECHNOLOGIES, INC., Hefei (CN)

(72) Inventors: Sheng-Hua Su, Hefei (CN); Minghung Hsieh, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 468 days.

(21) Appl. No.: 17/477,842

(22) Filed: Sep. 17, 2021

(65) Prior Publication Data

US 2022/0138386 A1  May 5, 2022

Related U.S. Application Data

(63) Continuation of application No. PCT/CN2021/099502, filed on Jun. 10, 2021.

(30) Foreign Application Priority Data

Nov. 3, 2020 (CN) .......................... 202011209440.X

(51) Int. Cl.
*G05B 19/418* (2006.01)
*G06F 30/327* (2020.01)

(52) U.S. Cl.
CPC ..... *G06F 30/327* (2020.01); *G05B 19/41865* (2013.01); *G05B 19/41885* (2013.01)

(58) Field of Classification Search
CPC ................. G06F 30/327; G06F 30/398; G05B 19/41865; G05B 19/41885; G05B 2219/2602; Y02P 90/02

See application file for complete search history.

(56) References Cited

U.S. PATENT DOCUMENTS 6,662,076 B1 * 12/2003 Conboy ............. G05B 19/4189
700/121
6,889,178 B1   5/2005 Chacon
(Continued)

FOREIGN PATENT DOCUMENTS

CN   105223914 A   1/2016
CN   109003919 A   12/2018
(Continued)

OTHER PUBLICATIONS

International Search Report as cited in PCT Application No. PCT/CN2021/099502 mailed Aug. 27, 2021, 9 pages.

*Primary Examiner* — Nghia M Doan
(74) *Attorney, Agent, or Firm* — Kilpatrick Townsend & Stockton LLP

(57) ABSTRACT

The present disclosure provides a method and an apparatus for setting wafer script, a device, and a storage medium. In response to the demand unit determining that the execution necessary condition of the script to be executed satisfies the business requirement based on the parameter information, the platform unit acquires the lot identification of the script to be executed and the corresponding production information. In response to the demand unit determining that the script to be executed is executed for the wafers corresponding to the script to be executed for the first time, the platform unit detects whether the first production information corresponding to the first wafers satisfies the execution necessary condition. If satisfied, the platform unit sets parameter information and assignment information for the first wafers, and synchronizes the first wafers with the set information to the material execution unit such that the material execution unit performs corresponding operation.

20 Claims, 7 Drawing Sheets

(56) References Cited

U.S. PATENT DOCUMENTS

2006/0245634 A1* 11/2006 Soenksen ............ G06T 7/0004
382/149
2010/0204940 A1* 8/2010 Barthold ............ G06Q 10/00
707/E17.046

FOREIGN PATENT DOCUMENTS

| CN | 106206356 B | 5/2019 |
| TW | I234056 B | 6/2005 |

* cited by examiner

METHOD AND APPARATUS FOR SETTING WAFER SCRIPT, DEVICE AND STORAGE MEDIUM

CROSS-REFERENCE TO RELATED APPLICATIONS

This application is a continuation application of International Patent Application No. PCT/CN2021/099502, which claims priority to Chinese Patent Application No. 202011209440.X, filed with the Chinese Patent Office on Nov. 3, 2020 and entitled "METHOD AND APPARATUS FOR SETTING WAFER SCRIPT, DEVICE AND STORAGE MEDIUM." International Patent Application No. PCT/CN2021/099502 and Chinese Patent Application No. 202011209440.X are incorporated herein by reference in their entireties.

TECHNICAL FIELD

The present disclosure relates to the field of integrated circuit and semiconductor technologies, and in particular to a method and an apparatus for setting wafer script, a device and a storage medium.

BACKGROUND

With the rapid development of computer technology and internet technology, the integrated circuit industry is ushering in an important period of opportunity and challenge for development. In the actual production conditions of wafers, due to business requirement, demand applicants often adjust wafer execution script according to the actual situation needs, so as to propose modification requirement to a setter of the execution script.

In the prior art, when a demand applicant proposes a modification requirement, the setter needs to change the corresponding execution script for the requirement. Further, when the execution script is changed, the corresponding modification is only based on the lot identification provided by the demand applicant, which not only fails to change in real time, but also fails to verify the production information of the current lot of wafers, thus it is very easy to cause lot scraping of the wafers due to error in the modification of script. In addition, in the existing solutions, the demand applicant needs to submit the corresponding information to the setter every time for the modification demand, which takes a long time, especially when the number of wafers in the same lot is large, it leads to the long process of executing the script and affects the overall efficiency of the production system.

It can be seen that in view of the above problems existing in the existing solutions, a solution is urgently needed.

SUMMARY

According to multiple embodiments, the first aspect of the present application provides a method for setting wafer script, which is applicable to a manufacturing execution system, wherein the system includes a demand unit, a set unit, a platform unit, and a material execution unit; the method includes:

acquiring, by the platform unit, lot identification of the script to be executed and corresponding production information, in response to the demand unit determining, based on parameter information, that execution necessary condition of the script to be executed satisfies business requirement, wherein the execution necessary condition is corresponding condition set by the set unit for the script to be executed according to the business requirement;

detecting, by the platform unit, whether first production information corresponding to first wafers satisfies the execution necessary condition, in response to the demand unit determining that the script to be executed is executed for wafers corresponding to the script to be executed for the first time, wherein the first wafers are selected by the demand unit and imported into the platform unit, for executing the script to be executed for the first time; and setting, by the platform unit, the parameter information and assignment information for the first wafers in response to the testing result being yes, and synchronizing the first wafers with the set information to the material execution unit such that the material execution unit executes corresponding operation.

According to multiple embodiments, the second aspect of the present application provides an apparatus for setting wafer script. The apparatus for setting wafer script includes:

an acquiring module, configured to acquire, by a platform unit, lot identification of script to be executed and corresponding production information, in response to a demand unit determining, based on parameter information, that execution necessary condition of the script to be executed satisfies business requirement, wherein the execution necessary condition is corresponding condition set by a set unit for the script to be executed according to the business requirement;

a detecting module, configured to detect, by the platform unit, whether first production information corresponding to first wafers satisfies the execution necessary condition, in response to the demand unit determining that the script to be executed is executed for the wafers corresponding to the script to be executed for the first time, wherein the first wafers are selected by the demand unit and imported into the platform unit, for executing the script to be executed for the first time;

a setting module, configured to set the parameter information and assignment information for the first wafers by the platform unit in response to the testing result being yes, and synchronize the first wafers with the set information to a material execution unit such that the material execution unit performs corresponding operation.

According to multiple embodiments, the third aspect of the present application provides an Electronic device. The Electronic device includes:

at least one processor; and a memory communicably connected with the at least one processor; wherein the memory stores instructions executable by the at least one processor, and the instructions are executed by the at least one processor such that the at least one processor is able to execute the method for setting wafer script as defined in any one of the first aspect and the optional implementations of the first aspect.

According to multiple embodiments, the fourth aspect of the present application provides a non-transitory computer-readable storage medium. The non-transitory computer-readable storage medium stores computer instructions thereon, wherein the computer instructions are configured to enable the computer to execute the method for setting wafer script as defined in any one of the first aspect and the optional implementations of the first aspect.

DESCRIPTION OF EMBODIMENTS

Figure 1:
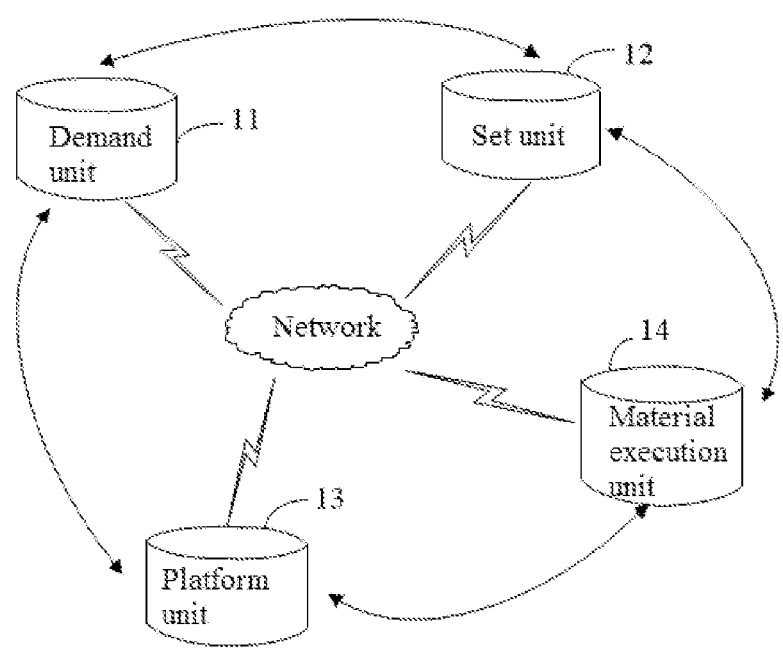
FIG. 1 is a schematic diagram of an application scenario according to embodiments of the present disclosure.

The exemplary embodiments will be described in detail herein, and examples thereof are shown in the accompanying drawings. When the following description refers to the drawings, unless otherwise indicated, the same number in different drawings indicates the same or similar elements. The implementations described in the following exemplary embodiments do not represent all implementations be consistent with the present disclosure. Rather, they are merely examples of methods and apparatus consistent with some aspects of the present disclosure as detailed in the appended claims.

The terms "first", "second", "third", "fourth" and the like (if any) in the description, claims and the drawings of the present disclosure are intended to distinguish similar objects, and not intended to describe a specific order or sequence. It should be understood that the data used in this way can be interchanged under appropriate circumstances, such that the embodiments of the present disclosure described herein can be implemented in a sequence other than those illustrated or described herein, for example. In addition, the terms "including" and "having" and any variations thereof are intended to cover non-exclusive inclusions. For example, a process, method, system, product, or device that includes a series of steps or units is not necessarily limited to those clearly listed, but may include other steps or units that are not clearly listed or are inherent to the processes, methods, products, or devices.

At present, the wafer production process is often implemented based on the Manufacturing Execution System (MES). In actual working conditions, the demand applicant often adjusts the wafer execution script according to the actual working condition needs. For example, the process of the existing solution is substantially as follows: the demand applicant proposes corresponding bill of lading information to the setter for each demand, the setter modifies the execution script according to the lot identification (Lot ID) in the bill of lading information, which not only fails to realize real-time modification, but also fails to verify the modified execution script, and it is very easy to cause lot scraping of wafers due to errors in the modification of script. In addition, in the existing solutions, corresponding execution process needs to be modified when the applicant proposes the modification demand every time, which takes a long time, especially when the number of lots is large, and affects the overall efficiency of the production system.

For the above problems in the prior art, the present disclosure provides a method and an apparatus for setting wafer script, a device, and a storage medium. In the method for setting wafer script according to the present disclosure, first a demand unit determines, based on the parameter information, corresponding condition set by a set unit for the script to be executed, that is, whether an execution necessary condition satisfies the business requirement. If satisfied, a platform unit acquires lot identification of the script to be executed and corresponding production information. Next, in response to the demand unit determining that the script to be executed is executed for the wafers corresponding to the script to be executed for the first time, the platform unit detects whether first production information of first wafers selected by the demand unit and imported into the platform unit satisfies the execution necessary condition. If the testing result is yes, the platform unit automatically sets parameter information and assignment information for the first wafers, and sends the first wafers with the set information to a material execution unit such that the material execution unit performs corresponding operation. Based on the platform unit and the execution necessary condition, there is no need to modify the script process, the real-time setting of the script to be executed of wafers can be realized, and by detecting whether production information satisfies the execution necessary condition, the script to be executed that does not satisfy the execution necessary condition is avoided from the source, thus avoiding the risk of lot scraping of wafers due to error of setting script. The method for setting wafer script according to the present disclosure can take effect once being set, the implementation process has a short time period, and the setting process is irrelevant to the number of lots, the overall production efficiency is not affected.

Hereinafter, exemplary application scenario of the embodiments of the present disclosure will be introduced.

A method for setting wafer script according to embodiments of the present disclosure can be executed by an apparatus for setting wafer script according to embodiments of the present disclosure. The method for setting wafer script according to the embodiments of the present disclosure is applicable to a Manufacturing Execution System (MES). The MES mainly involves a Specification Manager (SM) and a Material Manager (MM). FIG. 1 is a schematic diagram of an application scenario according to embodiments of the present disclosure. As shown in FIG. 1, the method for setting wafer script according to the embodiments of the present disclosure is applicable to MES, which includes a demand unit 11, a set unit 12, a platform unit 13 and a material execution unit 14. The set unit 12 may be provided in the SM, and the material execution unit 14 may be provided in the MM. The demand applicant provides business requirement and/or modification requirement through the demand unit 11, the set unit 12 performs corresponding script setting according to the requirement provided by the demand unit 11, and the platform unit 13 executes corresponding steps in the method for setting wafer script according to the embodiments of the present disclosure to realize the corresponding setting of the wafer script, and synchronizes the wafers with the set information to the material execution unit 14 such that the material execution unit 14 performs corresponding operation. It should be noted that in the MES, the data interaction among the demand unit 11, the set unit 12, the platform unit 13, and the material execution unit 14 may be realized through the network as the medium of the communication link. The network may include various connection types, for example, wired, wireless communication links or fiber-optic cables and so on. In addition, the platform unit 13 may write corresponding programs by programming languages such as C#, VB, C++, etc., to execute corresponding method configured for it. The module apparatus corresponding to the platform unit 13 may be an Electronic device such as a computer or a server, and the type of the Electronic device is not limited in embodiments of the present disclosure. The demand unit 11, the set unit 12, and the material execution unit 14 may accordingly configure the Electronic device according to actual situation of the MES in the actual working condition, which is not limited in the embodiments of the present disclosure.

It is worth noting that the above application scenario is only illustrative, and the method for setting wafer script according to the embodiments of the present disclosure includes but is not limited to the above application scenario.

The technical solutions of the present disclosure and how to solve the above technical problems by the technical solutions of the present disclosure will be described in detail below with specific embodiments. The following specific embodiments may be combined with each other, and the same or similar concepts or processes may not be repeated in some embodiments. The embodiments of the present disclosure will be described below with Reference to the accompanying drawings.

Figure 2:
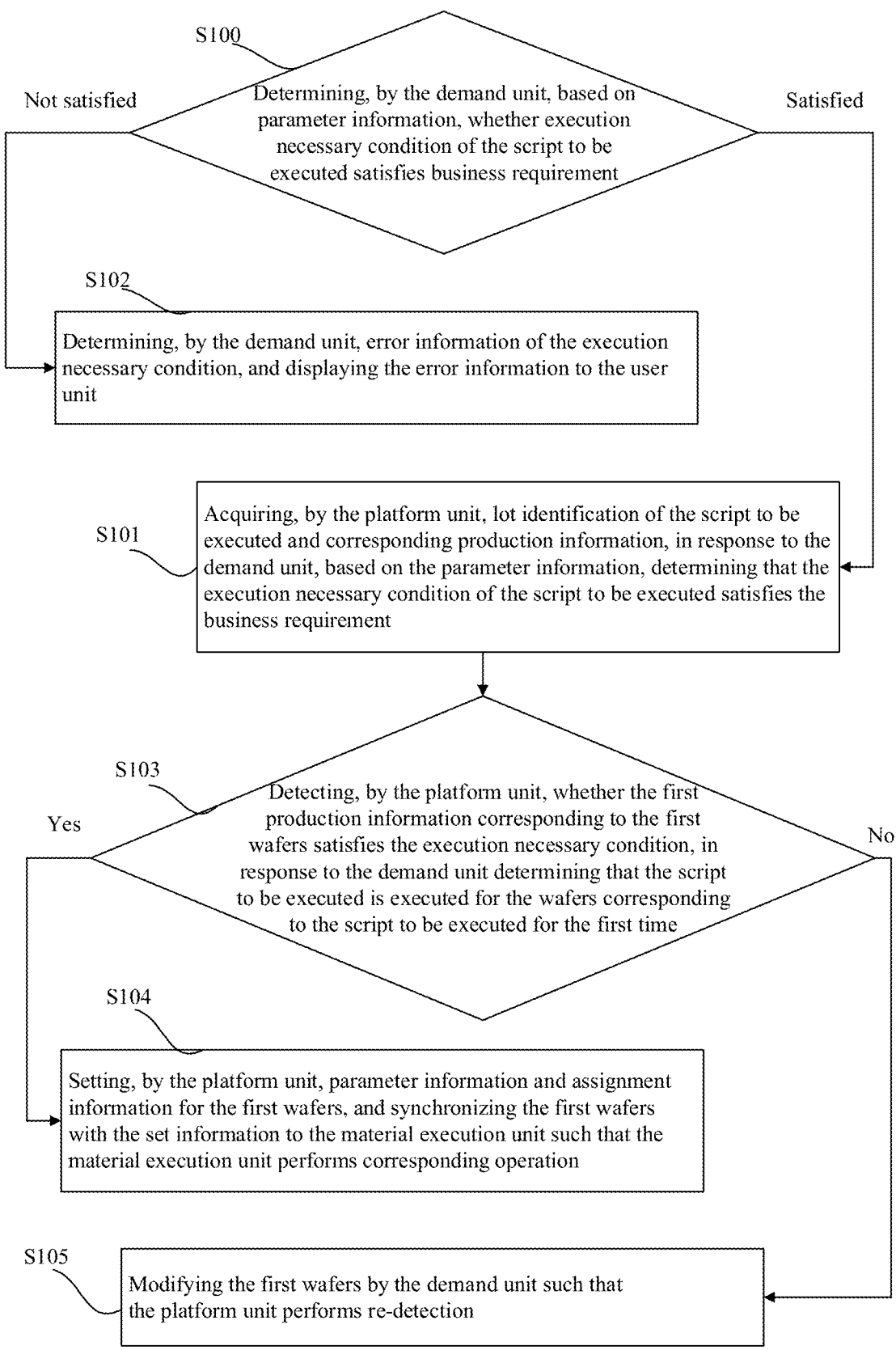
FIG. 2 is a schematic flowchart of a method for setting wafer script according to embodiments of the present disclosure.

FIG. 2 is a schematic flowchart of a method for setting wafer script according to embodiments of the present disclosure. As shown in FIG. 2, the method for setting wafer script according to the embodiments includes the following steps.

In S100, the demand unit determines, based on the parameter information, whether the execution necessary condition of the script to be executed satisfies the business requirement.

If yes, step S101 is executed. If no, step S102 is executed.

In S101, in response to the demand unit determining based on the parameter information that the execution necessary condition of the script to be executed satisfies the business requirement, the platform unit acquires the lot identification of the script to be executed and the corresponding production information.

The execution necessary condition is corresponding condition set by the set unit for the script to be executed according to the business requirement.

The demand unit proposes corresponding script requirement for the wafers to be executed with the script according to the business requirement, and the set unit sets corresponding condition for the wafers to be executed with the script according to the business requirement, i.e., the execution necessary condition. For example, at least one of lot type, lot product, corresponding execution site, script execution status of child and parent lots, maximum number of lots, and lot level acts as the execution necessary condition corresponding to the script to be executed. The corresponding execution site is a site at which the script to be executed is executed, and the script execution status of child and parent lots may be whether the script to be executed is executed for the wafers of child and parent lots corresponding to the script to be executed. For example, a set execution necessary condition may be "ABC+OPER: 005: Parameter name: XXX, value: Yes", that is, the $005^{th}$ site under the ABC process is to execute the script to be executed with the condition that the value of XXX is equal to Yes.

At the same time, the set unit sets unique parameter information for the demand unit, and associates the parameter information with the execution necessary condition, such that the demand unit may query the execution necessary condition associated with it according to the parameter information. The parameter information may be embodied in at least one expression form of letters, numbers, symbols, characters, and sentences, such as "Y", "、", "@!" and so on.

After the setter sets the necessary condition and parameter information for the script to be executed, the demand unit determines, based on the parameter information provided by the setter, whether the execution necessary condition of the script to be executed satisfies the business requirement, that is, the demand unit determines, based on the parameter information, whether the execution necessary condition set by the set unit satisfies the business requirement. After the determination, if satisfied, the platform unit acquires the lot identification corresponding to the script to be executed and the corresponding production information, so as to implement the setting steps for subsequently setting information. In this step, the demand unit judges, based on the parameter information, whether the execution necessary condition satisfies the business requirement, in order to ensure that the subsequent platform unit sets the business requirement satisfying the demand unit for the script of wafers of this lot.

Correspondingly, in response to the demand unit determining, based on the parameter information, that the execution necessary condition does not satisfy the business requirement, which indicates that there is error information in the set execution necessary condition, step S102 is executed.

In S102, the demand unit determines error information of the execution necessary condition, and displays the error information to a user unit.

When the demand unit determines that the execution necessary condition does not satisfy the business requirement, the demand unit further determines the error information in the execution necessary condition and displays the error information to the user unit. For example, it is displayed to the user unit through at least one display mode of the pop-up window mode, the alarm mode, the label mode, and the pop-up block mode, such that the user unit can be timely informed that there is an error information in the execution necessary condition, thereby preventing the error information from being stuck in the current stage and affecting the production process. The error information is displayed. It should be noted that the user unit in this step may be understood as a maintenance personnel unit or an external monitoring unit and the like in the MES, as a unit that can monitor and learn the current operating status of the MES in time, which is not limited in the embodiments of the present disclosure.

In S103, in response to the demand unit determining that the script to be executed is executed for the wafers corresponding to the script to be executed for the first time, the platform unit detects whether first production information corresponding to first wafers satisfies the execution necessary condition.

The first wafers are the wafers selected by the demand unit and imported into the platform unit for executing the script to be executed for the first time.

When the demand unit determines that the execution necessary condition of the script to be executed satisfies the business requirement, the platform unit acquires the lot identification corresponding to the script to be executed and corresponding production information. At this time, the demand unit also judges whether the script to be executed is executed or the wafers corresponding to the script to be executed for the first time. When the judgement result is yes, the demand unit selects the wafers for which the script to be executed is executed for the first time, for example, performs checking and confirming, and imports the selected wafers to be executed with script, that is, the checked and confirmed wafers to be executed with script, into the platform unit. Therefore, the wafers selected by the demand unit and imported into the platform unit for the first execution of the script to be executed are the first wafers, and its corresponding production information is the first production information. Specifically, the platform unit is only to determine the production information of the script to be executed selected and imported by the demand unit from the production information corresponding to the script to be executed acquired in step S101, that is, to determine the first production information. The first production information may be at least one of the current lot type, the current lot product, the corresponding execution site, the maximum number of lots, and the lot level corresponding to the first wafers. It can be understood that the first production information is configured to feed back the actual production status information of the first wafers when the material execution unit executes the script.

Further, the platform unit detects whether the first production information satisfies the execution necessary condition. If the detect result is yes, step S104 is executed, and if the detect result is no, step S105 is executed.

The platform unit detects whether the first production information satisfies the execution necessary condition to determine based on the production information whether there is the script to be executed of wafers that does not satisfy the execution necessary condition, so as to avoid the first wafers that do not satisfy the execution necessary condition from the source.

In S104, if the testing result is yes, the platform unit sets parameter information and assignment information for the first wafers, and synchronizes the first wafers with the set information to the material execution unit, such that the material execution unit performs corresponding operation.

After the platform unit detects whether the first production information satisfies the execution necessary condition, if the detect result is yes, that is, the first production information satisfies the execution necessary condition, at this time, the platform unit sets the parameter information and assignment information for the first wafers. The assignment information is the assignment agreed by the platform unit and the script to be executed corresponding to the first wafers. The first wafers with the set information are synchronized to the material execution unit, such that the material execution unit performs corresponding operation according to the first wafers with the set information.

Thus, the platform unit realizes setting parameter information and assignment information for the first wafers, and can ensure that the first wafers with the set information satisfy the corresponding requirement proposed by the demand unit, and there is no risk of wafer scraping. When the demand unit proposes the setting demand, there is no need to modify the script process for each setting demand, but the real-time setting and real-time effect of script of wafers of at least one lot are realized based on the execution necessary condition, which takes less time and the implement mode is simple and easy, and is irrelevant to the lot number of wafers. The script setting process may not affect the overall efficiency of the production system.

In S105, in response to the testing result is no, the demand unit modifies the first wafers such that the platform unit performs re-detection.

In response to the platform unit detecting that the first production information does not satisfy the execution necessary condition, for example, the first production information have passed the site due to the operating time difference of the system, and does not satisfy the previously set execution necessary condition. Therefore, the demand unit modifies the first wafers accordingly. After the modification, the platform unit redetermines the corresponding first production information, and detects whether the redetermined first production information satisfies the execution necessary condition again, and executes the subsequent corresponding steps according to the testing result.

In the method for setting wafer script according to the present disclosure, the set unit sets parameter information and execution necessary condition based on the business requirement provided by the demand unit. First, the demand unit determines whether the execution necessary condition of the script to be executed satisfies the business requirement based on the parameter information. In response to the result of determination being yes, the platform unit acquires the lot identification of the script to be executed and the corresponding production information. In response to the result of determination being no, the demand unit determines the corresponding error information and feeds the error information back to the user unit through the corresponding display mode. After determining that the execution necessary condition satisfies the business requirement, in response to the demand unit determining that the script to be executed is executed for the wafers corresponding to the script to be executed for the first time, the platform unit detects whether the first production information corresponding to the first wafers satisfies the execution necessary condition, in which the first wafers are the wafers selected by the demand unit and imported into the platform unit that are executed with the script to be executed for the first time. The platform unit performs detection and judgment. In response to the testing result is yes, the platform unit sets parameter information and assignment information for the first wafers, and synchronizes the first wafers with the set information to the material execution unit, such that the material execution unit performs the corresponding operation. The real-time setting of the script to be executed of wafers can be realized based on the platform unit and the execution necessary condition, without having to modify the script process, and the script to be executed that does not satisfy the execution necessary condition is avoided from the source by the detecting step, thus avoiding the risk of lot scraping of wafers due to error of setting script. The method for setting wafer script according to the present disclosure can take effect once being set, the implementation process has a short time period, the setting process is irrelevant to the number of lots, and the overall production efficiency may be not affected.

Figure 3:
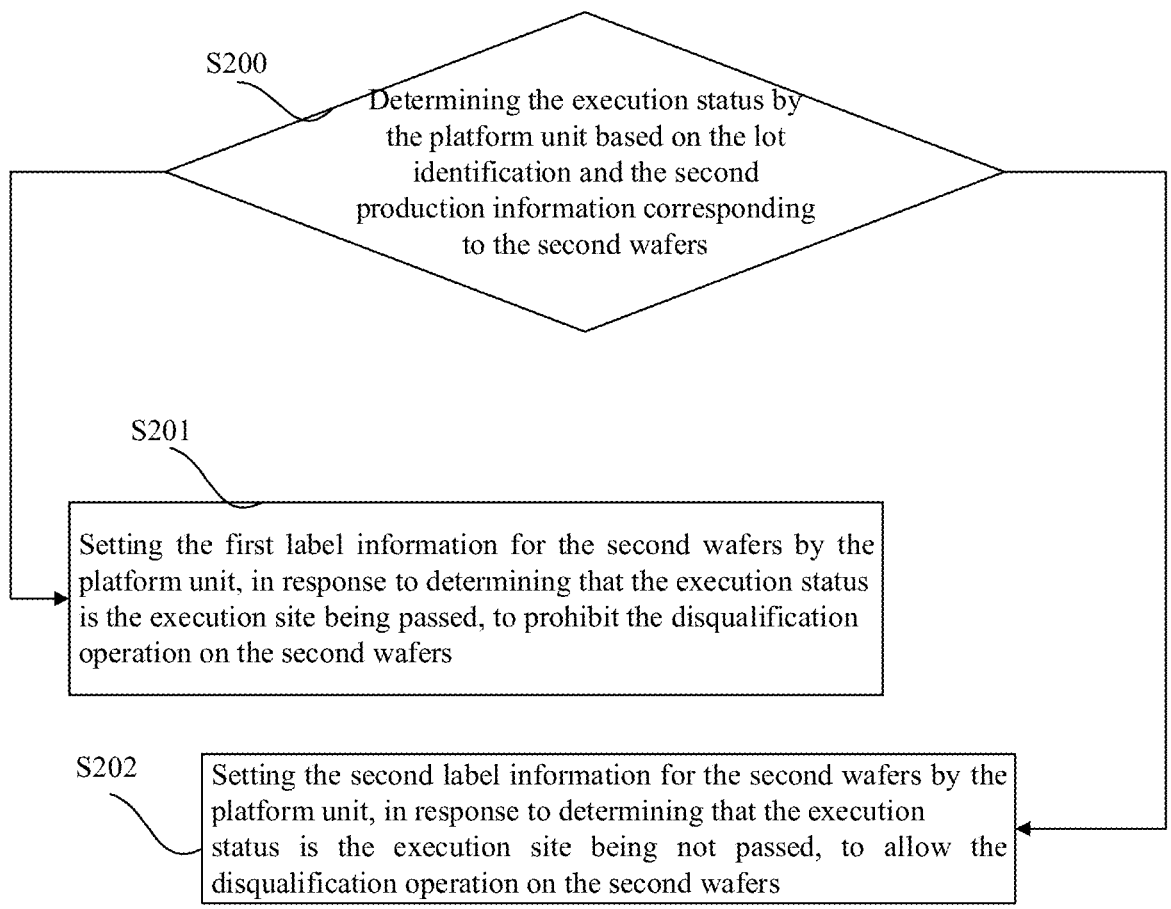
FIG. 3 is a schematic flowchart of another method for setting wafer script according to embodiments of the present disclosure.

In the above embodiments, in step S103, in response to the demand unit determining that the script to be executed is executed for the wafers corresponding to the script to be executed for the first time, the platform unit detects whether the first production information satisfies the execution necessary condition. On the other hand, in response to the demand unit determining that the script to be executed is not executed for the wafers corresponding to the script to be executed for the first time, the steps shown in the embodiments in FIG. 3 are executed. FIG. 3 is a schematic flowchart of another method for setting wafer script according to embodiments of the present disclosure. As shown in FIG. 3, in response to the demand unit determining that the script to be executed is not executed for the wafers corresponding to the script to be executed for the first time, the method for setting wafer script according to this embodiment includes the following steps.

In S200, the platform unit determines the execution status according to the lot identification and the second production information corresponding to the second wafers.

The execution status includes the execution site being passed or not passed, and the second wafers don't executed the script which to be executed for the first time.

In response to the demand unit determining that the script to be executed is not executed for the wafers corresponding to the script to be executed for the first time, it indicates that it is possible that the wafers corresponding to the current script to be executed can be disqualified. Therefore, the platform unit determines the current execution status of the corresponding script to be executed according to the lot identification and production information corresponding to the second wafers, to ascertain whether it may be disqualified. The second wafers don't executed the script which to be executed for the first time, the second production information is the production information corresponding to the second wafers, i.e., the wafers for which the script to be executed is not executed for the first time. Specifically, the platform unit may determine whether the execution status of the second wafers is the execution site being passed or not passed according to the lot identification of the script to be executed corresponding to the second wafers and the second production information.

In S201, in response to determining that the execution status is the execution site being passed, the platform unit sets the first label information for the second wafers to prohibit the disqualification operation on the second wafers.

The platform unit determines that the execution status is the execution site being passed according to the lot identification corresponding to the script to be executed of the second wafers and the second production information, which indicates that the corresponding script to be executed have been executed for the wafers with the lot identification, the execution qualification of the second wafers cannot be cancelled. Therefore, the platform unit may set the first label information for the corresponding second wafers, for example, mark the first label information, such as shading, on the corresponding lot identification and the second production information, to identify prohibition of the disqualification operation on the wafers corresponding to the current lot identification. Specifically, the platform unit displays the lot identification and production information corresponding to the second wafers, and prohibits the demand unit from checking and confirming the second wafers accordingly, that is, prohibits the disqualification operation on the second wafers.

In S202, in response to determining that the execution status is the execution site being not passed, the platform unit sets second label information for the second wafers to allow the disqualification operation on the second wafers.

In response to the platform unit determining, based on the lot identification corresponding to the script to be executed of the second wafers and the second production information, that the execution status is the execution site being not passed, it indicates that the corresponding script to be executed have not yet been executed for the wafers with the lot identification and the disqualification operation can be performed. Therefore, the platform unit may set the second label information for the script to be executed corresponding to the corresponding second wafers to identify that the disqualification operation is allowed to be performed on the wafers corresponding to the current lot identification. Specifically, the platform unit displays the lot identification and production information corresponding to the second wafers, to allow the demand unit to check and confirm the second wafers accordingly, that is, to allow the second wafers to be disqualified.

It is worth noting that the execution status may further include the wafers being in the execution site, but in actual working conditions, due to the control of the MES production system, it is impossible to edit the parameter information and production information of the wafers being produced, therefore step S201 may be performed, that is, the platform unit may set the first label information for the second wafers, the execution status of which is that the second wafers being in the execution site, for example, mark the corresponding lot identification and the second production information with the first label information, such as shading, to prohibit the disqualification operation on the wafers corresponding to the current lot identification. Specifically, the platform unit displays the lot identification and production information of the corresponding wafers, to prohibit the demand unit from checking and confirming the corresponding wafers, that is, to prohibit the disqualification operation on the corresponding wafers.

In the method for setting wafer script according to the above embodiments, in response to the demand unit determining that the script to be executed is the script which is not executed for the first time, the platform unit may determine, based on the lot identification corresponding to the script to be executed and the second production information, that the execution status is the execution site being passed or not passed, and determine according to the determined different execution statuses that which wafers that are not executed with the script to be executed for the first time may be disqualified. Thus, the functional operation of lot cancellation of execution qualification for lot wafers is realized by the platform unit, which saves manpower and time, and avoids the risk of lot scraping of wafers due to artificial cancellation of execution qualification.

In a possible implementation, in the above embodiment shown in FIG. 3, a possible implementation of allowing the second wafers to be disqualified is that the platform unit deletes the parameter information to cancel the corresponding qualification of the second wafers executing the corresponding script. Specifically, the platform unit deletes the parameter information, such that the script to be executed of the second wafers does not have the attribute of the parameter information, thereby achieving the purpose of canceling the corresponding qualification of the second wafers to execute the corresponding script.

In another possible implementation, the platform unit modifies the parameter information such that the modified parameter information does not satisfy the execution necessary condition. Specifically, the platform unit modifies the parameter information such that the modified parameter information does not match with the execution necessary condition, that is, does not satisfy the execution necessary condition. At this time, since the modified parameter information does not satisfy the execution necessary condition, the material execution unit does not execute the current script to be executed, whereby the purpose of disqualifying is achieved.

Figure 4:
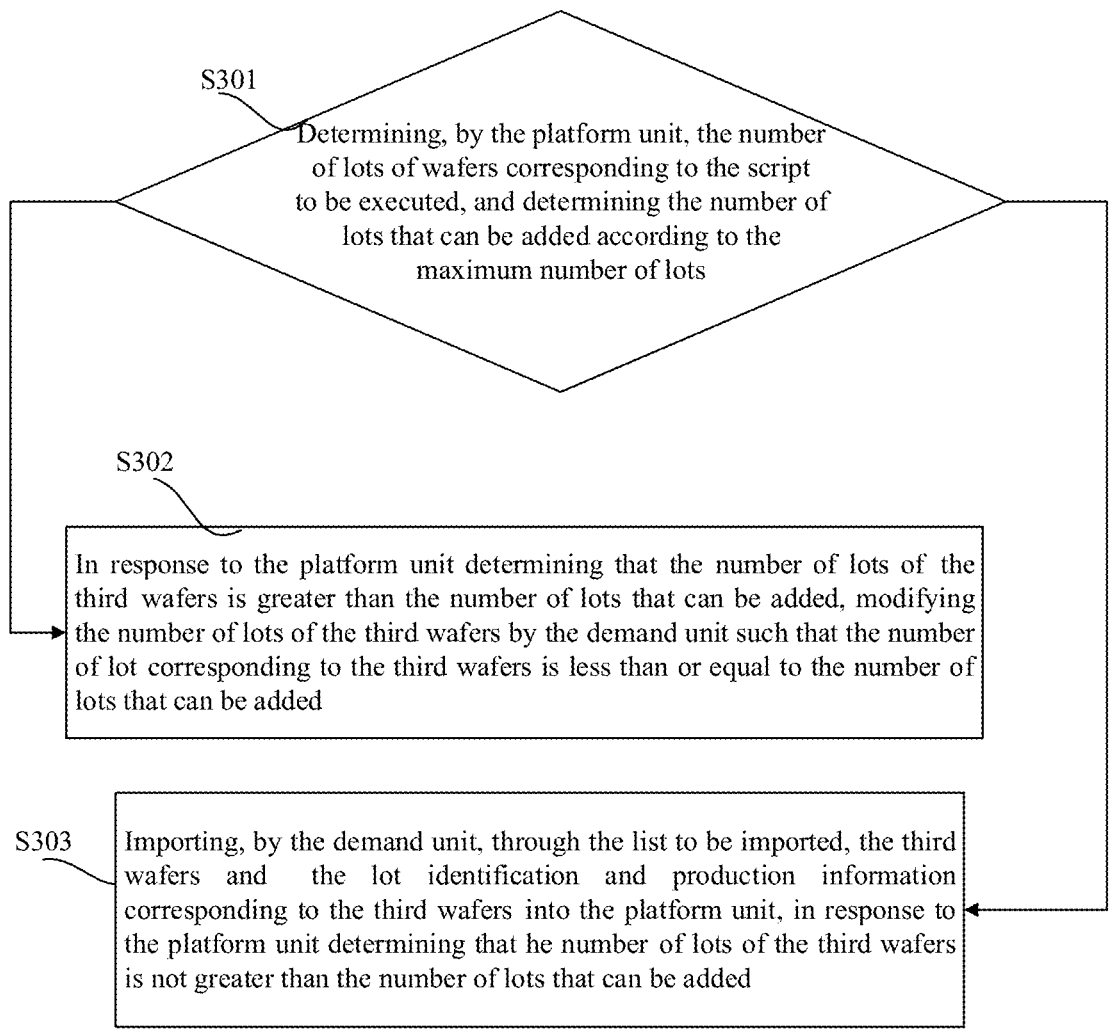
FIG. 4 is a schematic flowchart of yet another method for setting wafer script according to embodiments of the present disclosure.

In a possible implementation, after step S101, the method for setting wafer script according to the embodiments of the present disclosure further includes the steps shown in FIG. 4. FIG. 4 is a schematic flowchart of yet another method for setting wafer script according to embodiments of the present disclosure. As shown in FIG. 4, after the platform unit acquires the lot identification of the script to be executed and the corresponding production information, the method for setting wafer script according to this embodiment further includes the following steps.

In S301, the platform unit determines the number of lots of wafers corresponding to the script to be executed, and determines the number of lots that can be added according to the maximum number of lots.

After the platform unit acquires the lot identification of the script to be executed and the corresponding production information, the platform unit further acquires the number of lots of wafers corresponding to the script to be executed. The number of lots may be understood as the number of wafers of lots allowed by the MES system to execute the script to be executed. After determining the lot number of current wafers to be executed with the script, by comparing it with the maximum number of lots, it can be determined the number of lots that can be added, that is, the number of lots can be increased.

In S302, in response to the platform unit determining that the number of lots of the third wafers is greater than the number of lots that can be added, the demand unit modifies the number of lots of the third wafers such that the number of lots corresponding to the third wafers is less than or equal to the number of lots that can be added.

The third wafers are the wafers selected by the demand unit and for which the script to be executed is executed for the first time.

After determining the number of lots that can be added, in response to the platform unit determining that the number of lots of the third wafers is greater than the number of lots that can be added, in which the third wafers are wafers selected by the demand unit to be imported into the platform unit and for which the script to be executed is executed for the first time, the demand unit modifies the number of lots of the selected wafers, that is, modifies the number of lots of the third wafers, such that the number of lots thereof is less than or equal to the number of lots that can be added. After that, the modified third wafers and its corresponding lot identification and production information are imported into the platform unit.

In S303, in response to the platform unit determining that the number of lots of the third wafers is not greater than the number of lots that can be added, the demand unit imports the third wafers and the lot identification and production information corresponding to the third wafers into the platform unit through a list to be imported.

On the other hand, in response to the platform unit determining that the number of lots of the third wafers selected by the demand unit to be imported into the platform unit does not exceed the number of lots that can be added, the demand unit imports the third wafers and the lot identification corresponding to the third wafers and its production information into the platform unit through the list to be imported, such that the platform unit may acquire the first wafers.

In the method for setting wafer script according to the embodiments of the present disclosure, the platform unit judges whether the number of lots of the wafers (i.e., the third wafers) selected by the demand unit and for which the script to be executed is executed for the first time exceeds the number of lots that can be added. When exceeded, the demand unit may make corresponding modification. If the number of lots that can be added is not exceeded, the demand unit may import the third wafers and the lot identification and production information corresponding to the third wafers into the platform unit, the imported third wafers are the first wafers, which ensures the smooth of verification and information setting process of the subsequent platform unit, so as to improve the efficiency of setting wafer script, thereby improving the overall efficiency of the production system.

Figure 5:
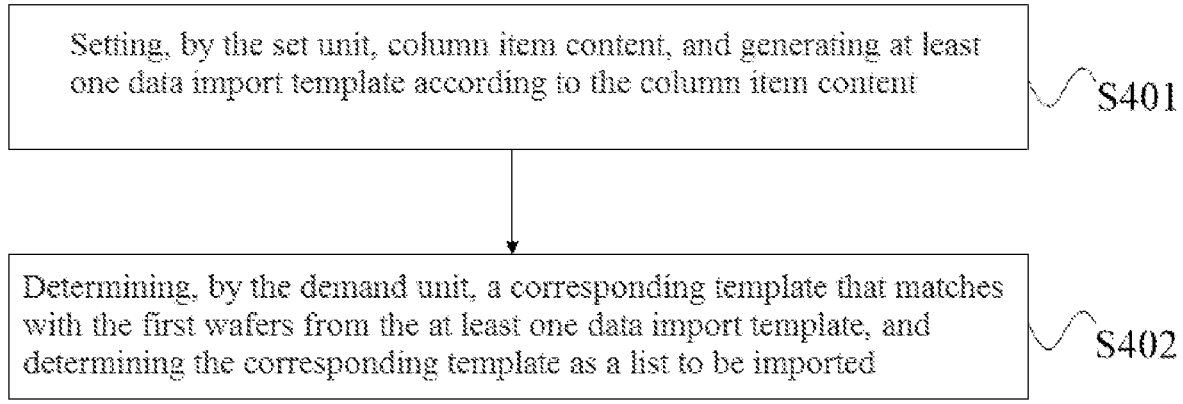
FIG. 5 is a schematic flowchart of still yet another method for setting wafer script according to embodiments of the present disclosure.

In the embodiment shown in FIG. 4, the demand unit imports, through the list to be imported, the third wafers and its corresponding lot identification and production information into the platform unit. Therefore, in a possible solution, a possible implementation of determining the list to be imported is shown in FIG. 5. FIG. 5 is a schematic flowchart of still yet another method for setting wafer script according to embodiments of the present disclosure. As shown in FIG. 5, before the demand unit imports, through the list to be imported, the third wafers and its corresponding lot identification and production information into the platform unit, the method for setting wafer script according to this embodiment further includes the following steps.

In S401, the set unit sets column item content, and generates at least one data import template according to the column item content.

The column item content is intended to characterize the characteristic information of the lot identification and the production information corresponding to the third wafers.

The set unit sets the column item content according to the characteristic information of the lot identification and the production information corresponding to the third wafers, and generates at least one data import template according to the set column item content. The column item content may include various characteristic information that can characterize the third wafers and its lot identification and production information. The column item content can also be understood as various information that may be included in the lot identification and production information of corresponding wafers, which is not limited in the embodiments of the present disclosure. After the column item content is set, based on it, at least one data import template is generated, in which the data import template includes one or more column item contents.

In S402, the demand unit determines a corresponding template matched with the first wafers from at least one data import template, and determines the corresponding template as a list to be imported.

After at least one data import template is generated, the demand unit determines a corresponding template matched with the first wafers from the at least one data import template, and then determines the determined corresponding template as the list to be imported, to import the corresponding wafers and its information into the platform unit through the list to be imported.

In the method for setting wafer script according to the embodiments of the present disclosure, before the demand unit imports, through the list to be imported, the selected wafers for which the script to be executed is executed for the first time (i.e., the third wafers) and its corresponding information into the platform unit, the list to be imported is to be determined. First, the set unit sets the column item content, and generates at least one data import template based on the column item content. The column item content is configured to characterize the characteristic information of the lot identification and the production information corresponding to the third wafers, and then the demand unit determines a corresponding template matched with the first wafers from at least one data import template, and determines the corresponding template as a list to be imported, so as to import the corresponding wafers and its corresponding information into the platform unit. Therefore, the list to be imported is determined from at least one data import template set by the set unit, which improves the integrity and stability of setting wafer script in the MES, ensures the smooth of the verification and information setting process of the subsequent platform unit, improves the efficiency of setting wafer script, thereby improving the overall performance of the production system.

The following is an apparatus according to embodiments of the present disclosure. The apparatus can be used to perform the method according to embodiments of the present disclosure. For details that are not disclosed in the apparatus according to embodiments of the present disclosure, Reference is made to the method according to embodiments of the present disclosure.

Figure 6:
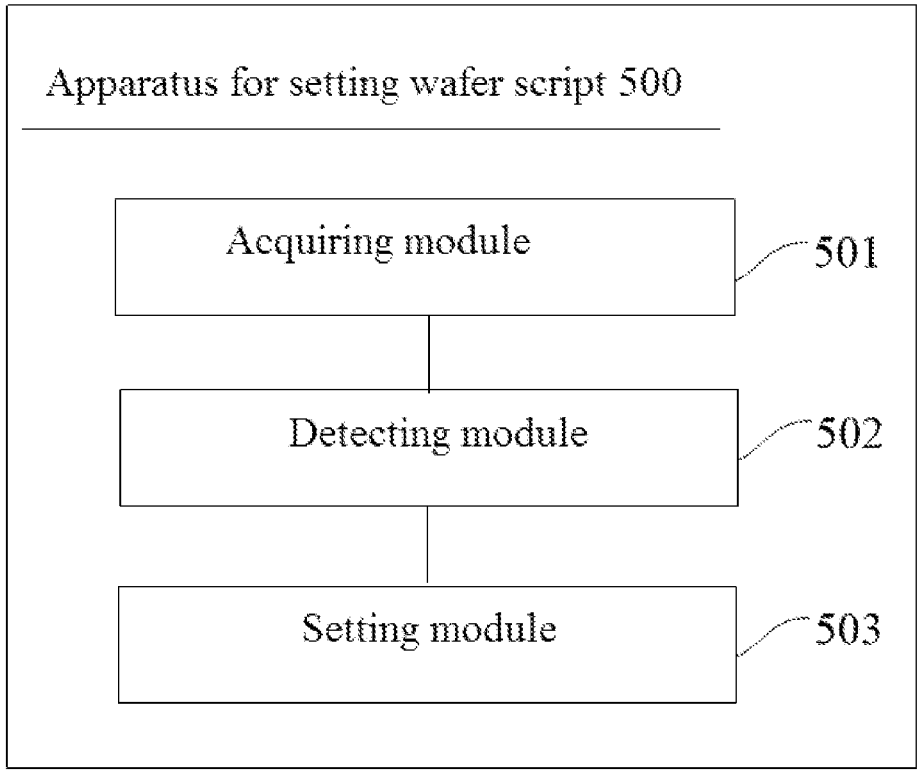
FIG. 6 is a schematic structural diagram of an apparatus for setting wafer script according to embodiments of the present disclosure.

FIG. 6 is a schematic structural diagram of an apparatus for setting wafer script according to embodiments of the present disclosure. As shown in FIG. 6, the apparatus for setting wafer script 500 according to this embodiment includes the following modules.

An acquiring module 501 is configured to acquire, by the platform unit, the lot identification of the script to be executed and the corresponding production information, in response to the demand unit, based on the parameter information, determining that the execution necessary condition of the script to be executed satisfies the business requirement.

The execution necessary condition is the corresponding condition set by the set unit for the script to be executed according to the business requirement.

A detecting module 502 is configured to detect, by the platform unit, whether the first production information corresponding to the first wafers satisfies the execution necessary condition, in response to the demand unit determining that the script to be executed is executed for the wafers corresponding to the script to be executed for the first time.

The first wafers are the wafers selected by the demand unit and imported into the platform unit, for which the script to be executed is executed for the first time.

A setting module 503 is configured to set, by the platform unit, parameter information and assignment information for the first wafers in response to the testing result being yes, and synchronizes the first wafers with the set information to the material execution unit such that the material execution unit executes the corresponding operation.

Figure 7:
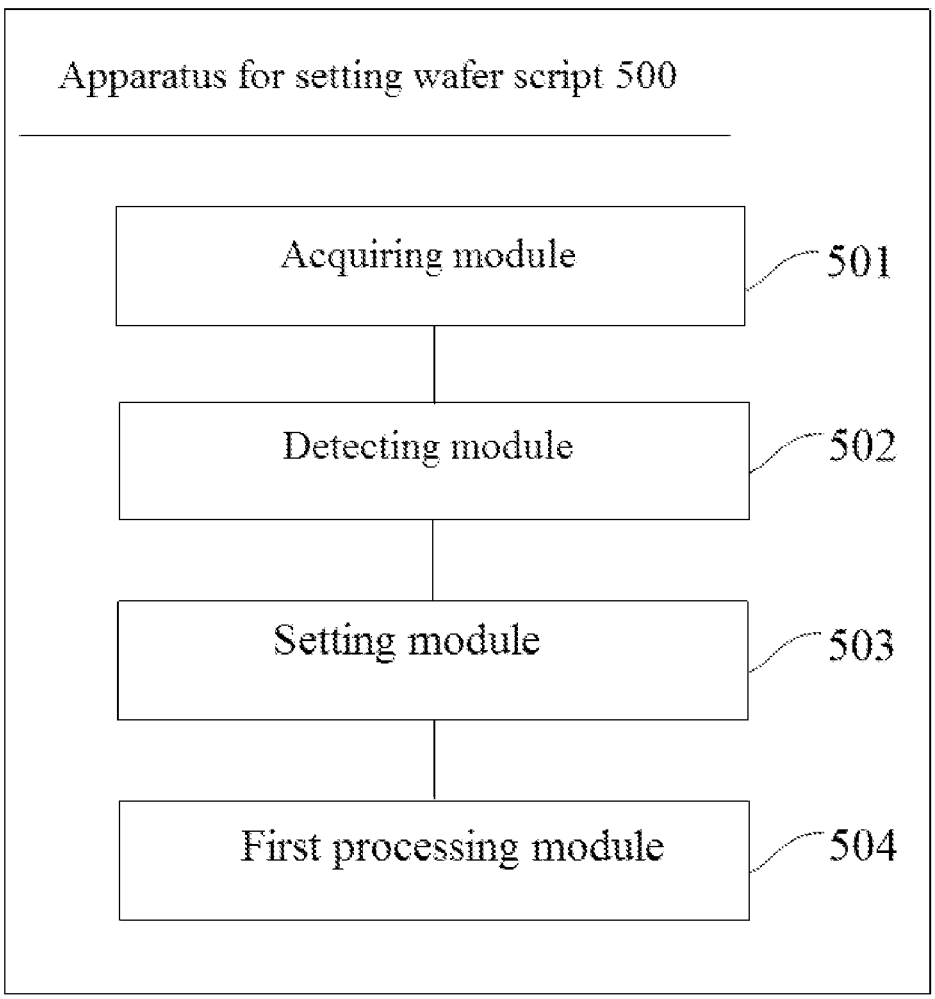
FIG. 7 is a schematic structural diagram of another apparatus for setting wafer script according to embodiments of the present disclosure.

Based on the embodiment shown in FIG. 6, FIG. 7 is a schematic structural diagram of another apparatus for setting wafer script according to embodiments of the present disclosure. As shown in FIG. 7, the apparatus for setting wafer script 500 according to this embodiment further includes a first processing module 504.

In response to the demand unit determines that the script to be executed is executed for the wafers for the first time, the first processing module 504 is configured to determine the execution status by the platform unit according to the lot identification corresponding to the second wafers and the second production information, and the execution status includes the execution site being passed or not passed.

Figure 8:
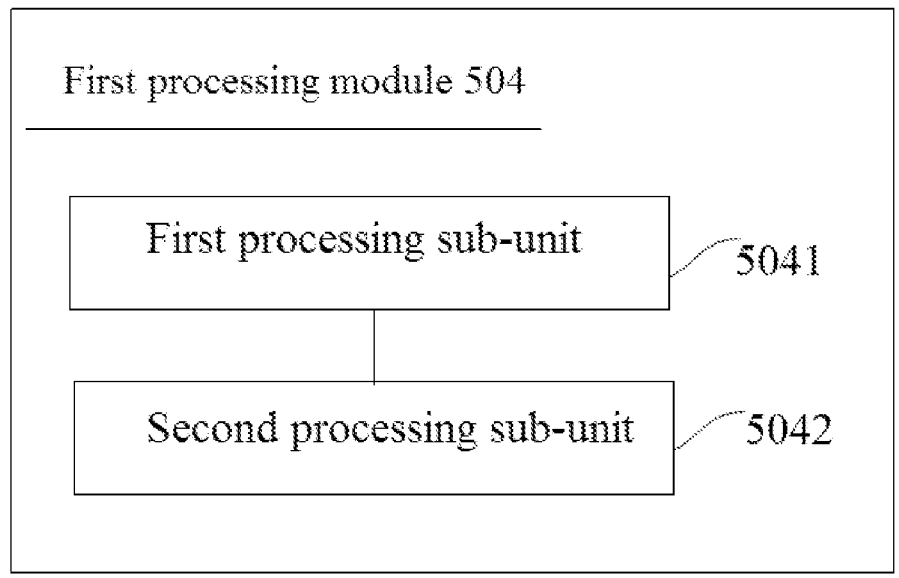
FIG. 8 is a schematic structural diagram of a first processing module according to embodiments of the present disclosure.

Based on the embodiment shown in FIG. 7, FIG. 8 is a schematic structural diagram of a first processing module according to embodiments of the present disclosure. As shown in FIG. 8, the first processing module 504 of the apparatus for setting wafer script 500 according to this embodiment includes a first processing sub-unit 5041 or a second processing sub-unit 5042.

The first processing sub-unit 5041 is configured to, in response to determining that the execution status is the execution site being passed, the platform unit sets the first label information for the second wafers to prohibit the disqualification operation on the second wafers.

The second processing sub-unit 5042 is configured to, in response to determining that the execution status is the execution site being not passed, the platform unit sets second label information for the second wafers to allow the disqualification operation on the second wafers.

In a possible implementation, the apparatus for setting wafer script 500 further includes a second processing module.

The second processing module is configured to:
delete the parameter information by the platform unit, to cancel the corresponding qualification of the second wafers for execution of the corresponding script; or
modify the parameter information by the platform unit such that the modified parameter information does not satisfy the execution necessary condition.

In a possible implementation, the apparatus for setting wafer script 500 further includes a display module.

The display module is configured to determine the error information of the execution necessary condition by the demand unit, and display the error information to the user unit.

In a possible implementation, the apparatus for setting wafer script 500 further includes a third processing module.

The third processing module is configured to:
determine the number of lots of wafers corresponding to the script to be executed by the platform unit, and determines the number of lots that can be added according to the maximum number of lots; and
in response to the platform unit determining that the number of lots of the third wafers is greater than the number of lots that can be added, modify the number of lots of the third wafers by the demand unit, such that the corresponding number of lots is less than or equal to the number of lots that can be added;
wherein the third wafers are the wafers selected by the demand unit, for which the script to be executed is executed for the first time.

In response to the platform unit determining that the number of lots of the third wafers is not greater than the number of lots that can be added, the demand unit imports, through the list to be imported, the third wafers and the lot identification and production information corresponding to the third wafers into the platform unit.

In a possible implementation, the apparatus for setting wafer script 500 further includes a fourth processing module.

The fourth processing module is configured to:
set the column item content by the set unit, and generate at least one data import template according to the column item content, in which the column item content is intended to characterize the characteristic information of the lot identification and the production information corresponding to the third wafers; and
determine a corresponding template matched with the first script to be executed by the demand unit from the at least one data import template, and determine the corresponding template as the list to be imported.

In a possible implementation, the apparatus for setting wafer script 500 further includes:

a fifth processing module configured to, in response to the testing result being no, modify the first wafers by the demand unit such that the platform unit perform re-detection.

In a possible implementation, the apparatus for setting wafer script 500 further includes:
- a sixth processing module configured to set parameter information and execution necessary condition by the set unit according to business requirement;
- wherein the execution necessary condition includes at least one of lot type, lot product, corresponding execution site, script execution status of child and parent lots, maximum number of lots, and lot level which correspond to the script to be executed; and
- the parameter information is relevant to the execution necessary condition.

The above embodiments of the apparatus according to the present disclosure are merely illustrative, and the division of modules of which is only a logical function division, and there may be other division ways in actual implementation. For example, multiple modules may be combined or integrated into another system. The mutual coupling between various modules may be realized through some interfaces. These interfaces are usually electrical communication interfaces, but it is not excluded that they may be mechanical interfaces or other forms of interfaces. Therefore, the modules described as separate components may or may not be physically separated, and may be located in one place or distributed at different locations on the same or different devices.

It is worth noting that the apparatus for setting wafer script according to the above embodiments is applicable to MES, and includes a demand unit, a set unit, a platform unit, and a material execution unit to execute corresponding steps of the wafer script setting according to the above embodiments. The specific implementations, principles, and technical effects are similar to the above method embodiments, and will not be repeated herein.

Figure 9:
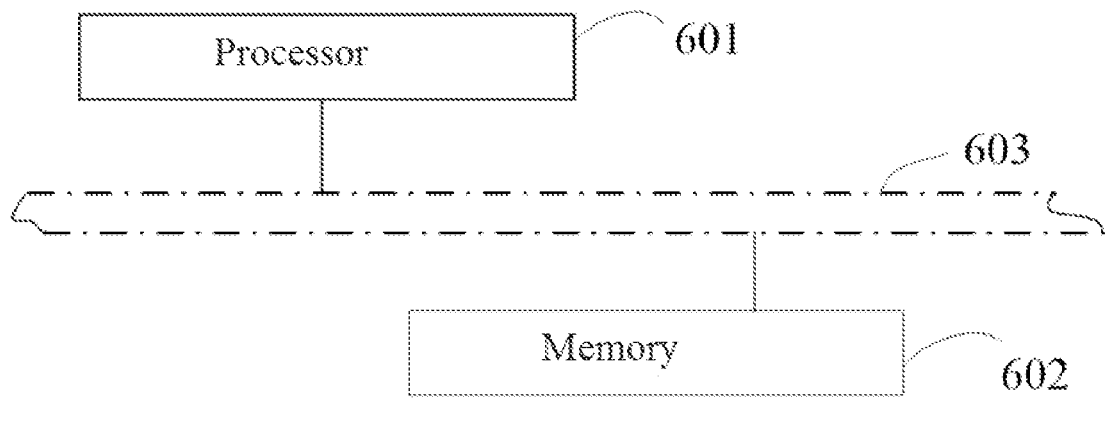
FIG. 9 is a schematic structural diagram of an Electronic device according to embodiments of the present disclosure.

FIG. 9 is a schematic structural diagram of an Electronic device according to embodiments of the present disclosure. As shown in FIG. 9, the Electronic device 600 according to this embodiment includes:
- at least one processor 601; and
- a memory 602 communicably connected with the at least one processor 601;
- wherein the memory 602 stores instructions that can be executed by the at least one processor 601, and the instructions are executed by the at least one processor 601, such that the at least one processor 601 can execute various steps of the method for setting wafer script in the above method embodiments. Reference can be made to the related description in the above method embodiments.

Optionally, the memory 602 may be separate or integrated with the processor 601.

When the memory 602 is a means independent of the processor 601, the Electronic device 600 may further include:
- a bus 603 configured to connect the processor 601 and the memory 602.

In addition, the embodiments of the present disclosure further provide a non-transitory computer-readable storage medium on which computer instructions are stored. The computer instructions are configured to enable the computer to execute various steps of the method for setting wafer script in the above embodiments. For example, the readable storage medium may be ROM, random access memory (RAM), CD-ROM, magnetic tape, floppy disk, optical data storage device, and so on.

After considering the specification and practicing the invention disclosed herein, those skilled in the art may easily conceive of other embodiments of the present disclosure. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are only regarded as exemplary, and the true scope and spirit of the present disclosure are indicated by the claims.

It should be understood that the present disclosure is not limited to the precise structures described above and shown in the drawings, and various modifications and changes can be made without departing from its scope. The scope of the present disclosure is only defined by the appended claims.

What is claimed is:

1. A method for setting wafer script, wherein
   the method for setting wafer script is applicable to a manufacturing execution system, the manufacturing execution system comprises a demand unit, a set unit, a platform unit, and a material execution unit; the method comprises:
   acquiring, by the platform unit, lot identification of script to be executed and corresponding production information, in response to the demand unit determining, based on parameter information, that execution necessary condition of the script to be executed satisfies business requirement, wherein the execution necessary condition is corresponding condition set by the set unit for the script to be executed according to the business requirement;
   detecting, by the platform unit, whether first production information corresponding to first wafers satisfies the execution necessary condition, in response to the demand unit determining that the script to be executed is executed for wafers corresponding to the script to be executed for the first time, wherein the first wafers are selected by the demand unit and imported into the platform unit, for executing the script which to be executed for the first time; and
   setting, by the platform unit, the parameter information and assignment information for the first wafers in response to the detecting result being satisfied, and synchronizing the first wafers with the set information to the material execution unit such that the material execution unit executes corresponding operation.

2. The method for setting wafer script according to claim 1, wherein
   in response to the demand unit determining that the script to be executed is not executed for the wafers for the first time, the method further comprises:
   determining an execution status by the platform unit based on lot identification and second production information corresponding to second wafers, wherein the execution status comprises an execution site being passed or not passed, and the second wafers don't executed the script which to be executed for the first time.

3. The method for setting wafer script according to claim 2, wherein
   in response to determining that the execution status is the execution site being passed, the platform unit sets first label information for the second wafers to prohibit disqualification operation on the second wafers;

or in response to determining that the execution status is the execution site being not passed, the platform unit sets second label information for the second wafers to allow disqualification operation on the second wafers.

4. The method for setting wafer script according to claim 3, wherein allowing disqualification operation on the second wafers comprises:

deleting the parameter information by the platform unit to cancel corresponding qualification of the second wafers for execution of corresponding script; or modifying the parameter information by the platform unit, such that the modified parameter information does not satisfy the execution necessary condition.

5. The method for setting wafer script according to claim 1, wherein in response to the demand unit determining, based on the parameter information, that the execution necessary condition of the script to be executed dissatisfy the business requirement, the method further comprises:

determining, by the demand unit, error information of the execution necessary condition, and displaying the error information to a user unit.

6. The method for setting wafer script according to claim 5, wherein after the platform unit acquires the lot identification of the script to be executed and the corresponding production information, the method further comprises:

determining, by the platform unit, the number of lots of wafers corresponding to the script to be executed, and determining the number of lots that can be added according to the maximum number of lots;

in response to the platform unit determining that the number of lots of third wafers is greater than the number of lots that can be added, modifying the number of lots of the third wafers by the demand unit, such that the corresponding number of lots is less than or equal to the number of lots that can be added, wherein the third wafers are wafers selected by the demand unit, for which the script to be executed is executed for the first time; and importing, by the demand unit, through a list to be imported, the third wafers and the lot identification and the production information corresponding to the third wafers into the platform unit, in response to the platform unit determining that the number of lots of the third wafers is not greater than the number of lots that can be added.

7. The method for setting wafer script according to claim 6, wherein before Importing, by the demand unit, through the list to be imported, the third wafers and the lot identification and the production information corresponding to the third wafers into the platform unit, the method further comprises:

setting, by the set unit, column item content, and generating at least one data import template according to the column item content, wherein the column item content is configured to characterize characteristic information of the lot identification and the production information corresponding to the third wafers; and determining, by the demand unit, a corresponding template that matches with the first wafers from the at least one data import template, and determining the corresponding template as the list to be imported.

8. The method for setting wafer script according to claim 7, wherein in response to the detecting result being dis-satisfied, the demand unit modifies the first wafers such that the platform unit performs re-detection.

9. The method for setting wafer script according to claim 8, wherein before determining, by the demand unit, based on the parameter information, that the execution necessary condition of the script to be executed satisfies the business requirement, the method further comprises:

setting, by the set unit, based on the business requirement, the parameter information and the execution necessary condition;

wherein the execution necessary condition comprises at least one of lot type, lot product, corresponding execution site, script execution status of child and parent lots, the maximum number of lots, and lot level which correspond to the script to be executed; and the parameter information is relevant to the execution necessary condition.

10. An apparatus for setting wafer script, comprising:

an acquiring module configured to acquire lot identification of script to be executed and corresponding production information by a platform unit, in response to a demand unit determining that execution necessary condition of the script to be executed satisfies business requirement according to parameter information, wherein the execution necessary condition is corresponding condition set by a set unit for the script to be executed according to the business requirement;

a testing module configured to detect whether first production information corresponding to first wafers satisfies the execution necessary condition by the platform unit, in response to the demand unit determining that the script to be executed is executed for wafers corresponding to the script to be executed for the first time, wherein the first wafers are wafers selected by the demand unit and imported into the platform unit, for which the script to be executed is executed for the first time; and a setting module configured to set the parameter information and assignment information for the first wafers by the platform unit in response to the detecting result being satisfied, and synchronize the first wafers with the set information to a material execution unit such that the material execution unit performs corresponding operation.

11. The apparatus for setting wafer script according to claim 10, wherein in response to the demand unit determining that the script to be executed is not executed for the wafers for the first time, the apparatus further comprises:

a first processing module configured to determine an execution status by the platform unit according to lot identification corresponding to second wafers and second production information, wherein the execution status comprises an execution site being passed or not passed, and the second wafers don't executed the script which to be executed for the first time.

12. The apparatus for setting wafer script of claim 11, wherein the first processing module comprises:

a first processing sub-unit configured to set first label information for the second wafers by the platform unit in response to determining that the execution status is the execution site being passed, to prohibit disqualification operation on the second wafers; or a second processing sub-unit configured to set second label information for the second wafers by the platform unit in response to determining that the execution status is the execution site being not passed, to allow the disqualification operation on the second wafers.

13. The apparatus for setting wafer script according to claim 12, wherein the apparatus further comprises a second processing module, the second processing module is configured to:

delete the parameter information by the platform unit to cancel corresponding qualification of the second wafers for execution of corresponding script; or modify the parameter information by the platform unit such that the modified parameter information does not satisfy the execution necessary condition.

14. The apparatus for setting wafer script according to claim 10, wherein the apparatus further comprises:

a display module configured to determine error information of the execution necessary condition by the demand unit and display the error information to a user unit.

15. The apparatus for setting wafer script according to claim 11, wherein the apparatus further comprises:

a display module configured to determine error information of the execution necessary condition by the demand unit and display the error information to a user unit.

16. The apparatus for setting wafer script according to claim 14, wherein the apparatus further comprises a third processing module, the third processing module is configured to:

determine the number of lots of wafers corresponding to the script to be executed by the platform unit, and determine the number of lots that can be added according to maximum number of lots;

modify the number of lots of third wafers by the demand unit in response to the platform unit determining that the number of lots of the third wafers is greater than the number of lots that can be added, such that the corresponding number of lots is less than or equal to the number of lots that can be added, wherein the third wafers are wafers selected by the demand unit and for which the script to be executed is executed for the first time; and import, by the demand unit, through a list to be imported, the third wafers and lot identification and production information corresponding to the third wafers into the platform unit, in response to the platform unit determining that the number of lots of the third wafers is not greater than the number of lots that can be added.

17. The apparatus for setting wafer script according to claim 16, wherein the apparatus further comprises a fourth processing module, the fourth processing module is configured to:

set column item content by the set unit, and generate at least one data import template according to the column item content, wherein the column item content is configured to characterize characteristic information of the lot identification and the production information corresponding to the third wafers; and determine a corresponding template that matches with the first wafers from the at least one data import template by the demand unit, and determine the corresponding template as the list to be imported.

18. The apparatus for setting wafer script according to claim 17, wherein the apparatus further comprises:

a fifth processing module configured to modify the first wafers by the demand unit in response to the detecting result being dis-satisfied, such that the platform unit performs re-detection.

19. The apparatus for setting wafer script according to claim 18, wherein the apparatus further comprises:

a sixth processing module configured to set the parameter information and the execution necessary condition by the set unit according to the business requirement;

wherein the execution necessary condition comprises at least one of lot type, lot product, corresponding execution site, script execution status of child and parent lots, the maximum number of lots, and lot level which correspond to the script to be executed; and the parameter information is relevant to the execution necessary condition.

20. An electronic device, comprising:

at least one processor; and a memory communicably connected with the at least one processor; wherein the memory stores instructions executable by the at least one processor, and the instructions are executed by the at least one processor such that the at least one processor is able to execute the method for setting wafer script which is applicable to a manufacturing execution system comprising a demand unit, a set unit, a platform unit, and a material execution unit;

wherein at least one processor is able to execute the method for setting wafer script comprising:

acquiring, by the platform unit, lot identification of script to be executed and corresponding production information, in response to the demand unit determining, based on parameter information, that execution necessary condition of the script to be executed satisfies business requirement, wherein the execution necessary condition is corresponding condition set by the set unit for the script to be executed according to the business requirement;

detecting, by the platform unit, whether first production information corresponding to first wafers satisfies the execution necessary condition, in response to the demand unit determining that the script to be executed is executed for wafers corresponding to the script to be executed for the first time, wherein the first wafers are selected by the demand unit and imported into the platform unit, for executing the script which to be executed for the first time; and setting, by the platform unit, the parameter information and assignment information for the first wafers in response to the detecting result being satisfied, and synchronizing the first wafers with the set information to the material execution unit such that the material execution unit executes corresponding operation.

* * * * *